US012642044B2

(12) United States Patent
Chiu et al.

(10) Patent No.: US 12,642,044 B2
(45) Date of Patent: May 26, 2026

(54) CONDUIT CHECK APPARATUS

(71) Applicant: Taiwan Semiconductor Manufacturing Company Limited, Hsin-Chu (TW)

(72) Inventors: Shih Yang Chiu, Taipei County (TW); Cheng-Lung Wu, Zhunan Township, Miaoli County (TW); Chai Hsien Chen, Tainan City (TW); Chaolin Lo, Tainan City (TW); Yang-Ann Chu, Hsinchu City (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 205 days.

(21) Appl. No.: 18/662,174

(22) Filed: May 13, 2024

(65) Prior Publication Data

US 2025/0349577 A1      Nov. 13, 2025

(51) Int. Cl.
*H10P 72/00* (2026.01)
*G02F 1/13* (2006.01)
*H10P 72/72* (2026.01)

(52) U.S. Cl.
CPC ...... *H10P 72/0604* (2026.01); *H10P 72/0402* (2026.01); *H10P 72/722* (2026.01); *G02F 1/132* (2013.01)

(58) Field of Classification Search
CPC ............. H10P 72/0604; H10P 72/0402; H10P 72/722; G02F 1/132; H01L 21/67017; H01L 21/67248; H01L 21/67253; H01L 21/67288; H01L 21/6831; H01L 21/6833
See application file for complete search history.

(56) References Cited

U.S. PATENT DOCUMENTS

| | | | | |
|---|---|---|---|---|
| 10,538,902 B2 * | 1/2020 | Searcy | .................... | E03B 7/045 |
| 2004/0159353 A1 * | 8/2004 | King | ....................... | E03D 5/003 |
| | | | | 137/337 |
| 2011/0168266 A1 * | 7/2011 | Fiora | ....................... | E03B 1/048 |
| | | | | 137/1 |
| 2012/0060945 A1 * | 3/2012 | Lee | ........................... | B05B 1/22 |
| | | | | 29/428 |
| 2013/0269799 A1 * | 10/2013 | Swist | ...................... | E03C 1/041 |
| | | | | 137/551 |
| 2014/0000718 A1 * | 1/2014 | Freudenberg | ........ | G01K 11/165 |
| | | | | 222/23 |
| 2020/0185254 A1 * | 6/2020 | Saito | ................. | H01L 21/67248 |

* cited by examiner

*Primary Examiner* — Patrick C Williams
(74) *Attorney, Agent, or Firm* — Cooper Legal Group, LLC

(57) ABSTRACT

A system includes an electrostatic chuck defining a first conduit configured to emit a first gas. The system includes a conduit check apparatus for identifying a first conduit status of the first conduit. The conduit check apparatus includes a thermochromic structure including a first region positioned relative to a flow path of the first gas emitted from the first conduit. The first region of the thermochromic structure produces a first visual indication of the first conduit status.

20 Claims, 11 Drawing Sheets 108
109

126

100

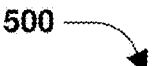

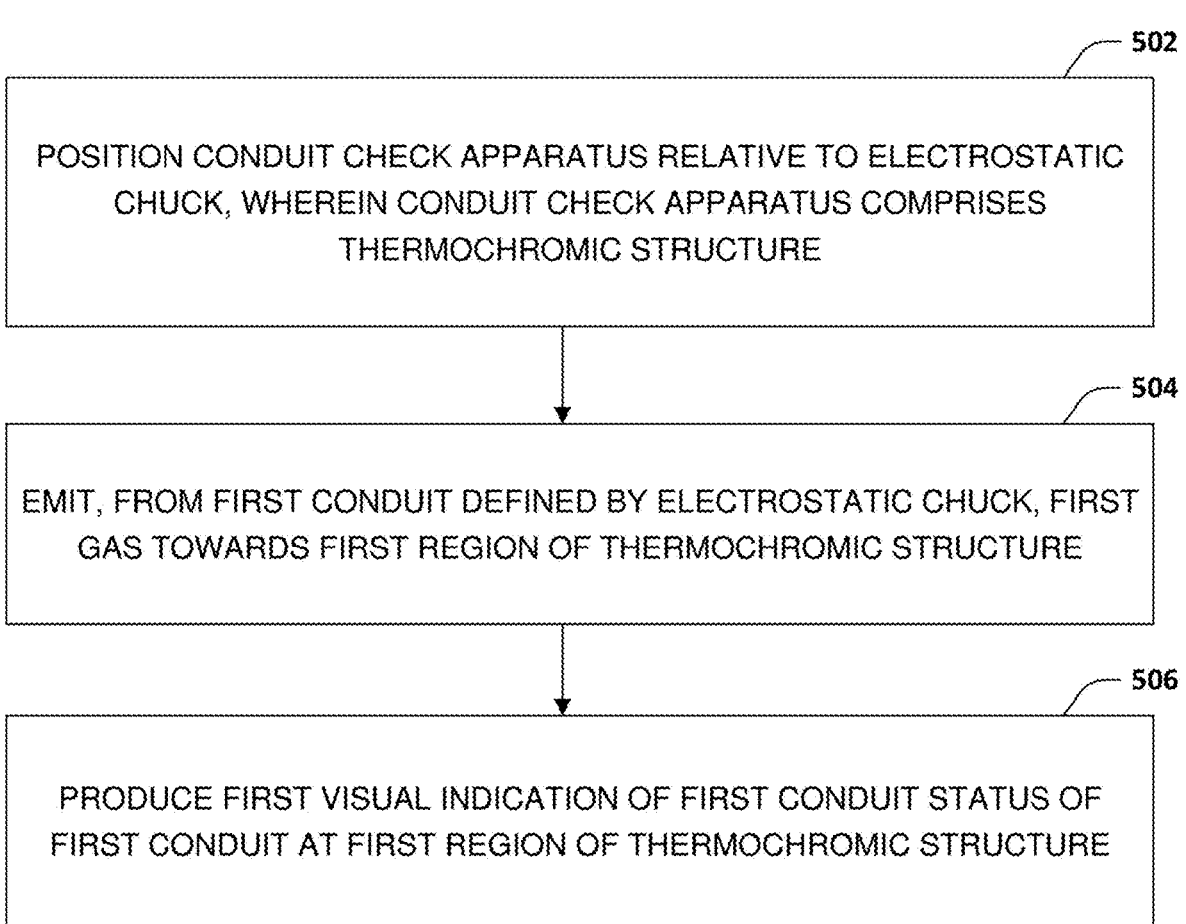

502

POSITION CONDUIT CHECK APPARATUS RELATIVE TO ELECTROSTATIC CHUCK, WHEREIN CONDUIT CHECK APPARATUS COMPRISES THERMOCHROMIC STRUCTURE

504

EMIT, FROM FIRST CONDUIT DEFINED BY ELECTROSTATIC CHUCK, FIRST GAS TOWARDS FIRST REGION OF THERMOCHROMIC STRUCTURE

506

PRODUCE FIRST VISUAL INDICATION OF FIRST CONDUIT STATUS OF FIRST CONDUIT AT FIRST REGION OF THERMOCHROMIC STRUCTURE

FIG. 5

CONDUIT CHECK APPARATUS

BACKGROUND

Semiconductor devices are formed on, in, and/or from semiconductor wafers, and are used in a multitude of electronic devices, such as mobile phones, laptops, desktops, tablets, watches, gaming systems, and various other industrial, commercial, and consumer electronics. One or more semiconductor fabrication processes are performed to form semiconductor devices on, in, and/or from a semiconductor wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 is a flow diagram illustrating a method of identifying a conduit status of a conduit, in accordance with some embodiments.

DETAILED DESCRIPTION

Figure 1A:
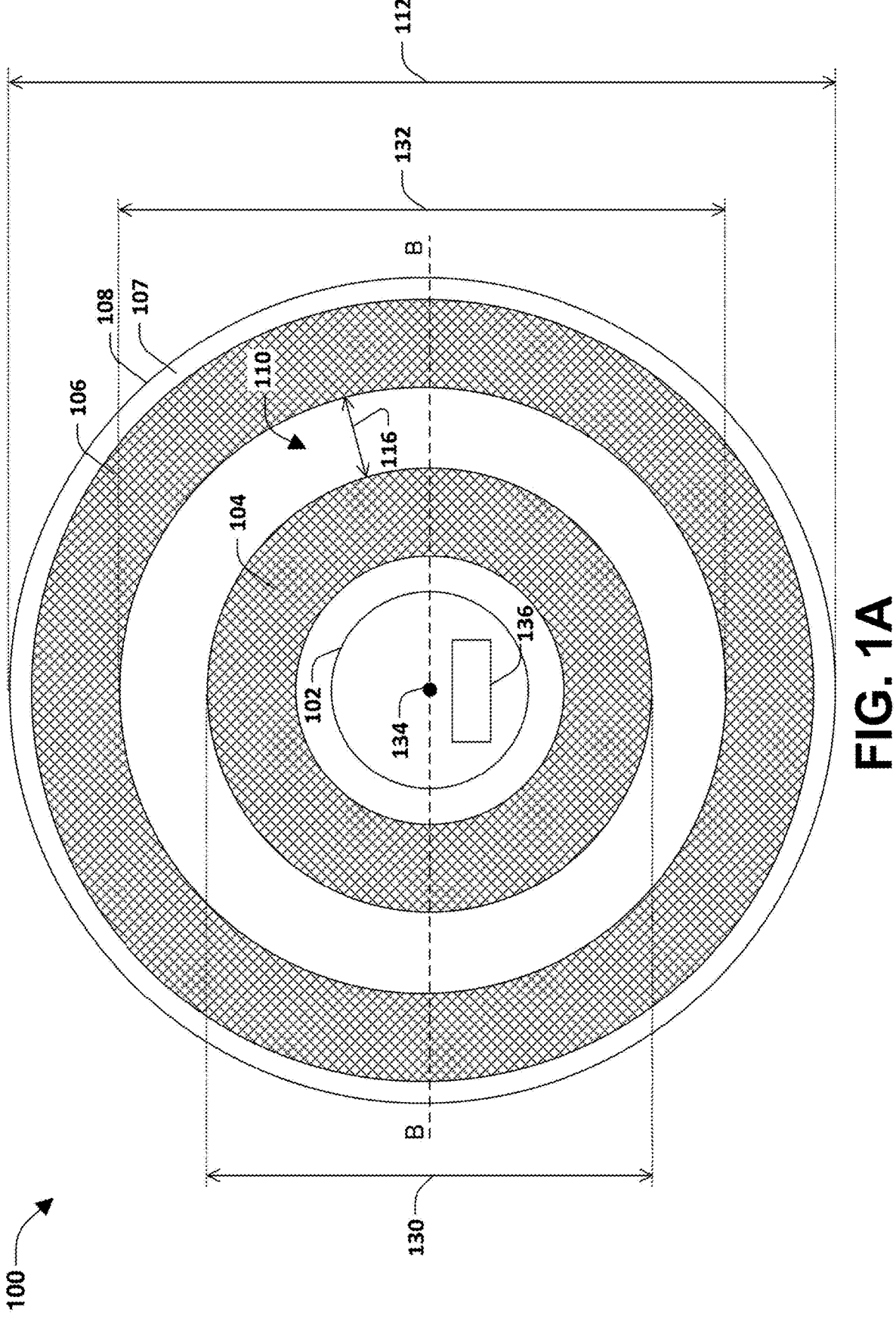
FIG. 1A illustrates a top view of a conduit check apparatus, in accordance with some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to other element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

The term "overlying" and/or the like may be used to describe one element or feature being vertically coincident with and at a higher elevation than another element or feature. For example, a first element overlies a second element if the first element is at a higher elevation than the second element and at least a portion of the first element is vertically coincident with at least a portion of the second element.

The term "underlying" and/or the like may be used to describe one element or feature being vertically coincident with and at a lower elevation than another element or feature. For example, a first element underlies a second element if the first element is at a lower elevation than the second element and at least a portion of the first element is vertically coincident with at least a portion of the second element.

The term "over" may be used to describe one element or feature being at a higher elevation than another element or feature. For example, a first element is over a second element if the first element is at a higher elevation than the second element.

The term "under" may be used to describe one element or feature being at a lower elevation than another element or feature. For example, a first element is under a second element if the first element is at a lower elevation than the second element.

Semiconductor wafers are subjected to various processes during the fabrication of semiconductor devices. In some embodiments, a semiconductor wafer is retained by an electrostatic chuck while a semiconductor fabrication process is performed on the semiconductor wafer. One or more conduits defined by the electrostatic chuck are used for introducing a gas to at least one of the semiconductor wafer or a processing chamber in which the semiconductor wafer is disposed. The gas is emitted from the one or more conduits for at least one of cooling of the semiconductor wafer, monitoring chuck performance of the electrostatic chuck, or other purpose. Over a tool life of the electrostatic chuck, particles including at least one of contaminants, polymers, etc. are introduced from at least one of the processing chamber, processed semiconductors, processing chemicals, etc. to a conduit of the electrostatic chuck. Build-up of the particles in the conduit obstructs passage of gas through the conduit. The obstruction of the gas through the conduit at least one of (i) increases a likelihood of a semiconductor wafer being damaged such as chipped, broken, cracked, internally damaged, fragmented, etc. while the semiconductor wafer is retained by or being lifted off of the electrostatic chuck, (ii) negatively impacts a quality of the semiconductor wafer and/or a semiconductor wafer process performed on the semiconductor wafer while the semiconductor wafer is retained by the electrostatic chuck, or (iii) results in other negative impacts on at least one of the electrostatic chuck, the semiconductor wafer, etc. In some systems, a technician is required to manually disassemble the electrostatic chuck and inspect disassembled parts of the electrostatic chuck to check for conduit blockage, which requires a significant amount of time, manpower, and tools.

In accordance with some embodiments, a conduit check apparatus is provided which is usable for automatically identifying conduit statuses of one or more conduits of the electrostatic chuck. In some embodiments, the conduit check apparatus identifies the conduit statuses without having to manually disassemble the electrostatic chuck, thereby mitigating unnecessary use of time, resources, etc. The conduit check apparatus comprises a thermochromic structure positioned relative to a conduit defined by the electrostatic chuck while a gas is emitted from the conduit. A region of the thermochromic structure produces a visual indication of a conduit status of the conduit, such as due, at least in part, to (i) a color pattern of the region of the thermochromic structure being temperature dependent and (ii) a temperature of the region of the thermochromic structure being dependent upon an amount of gas emitted from the conduit that reaches the region.

Figure 1B:
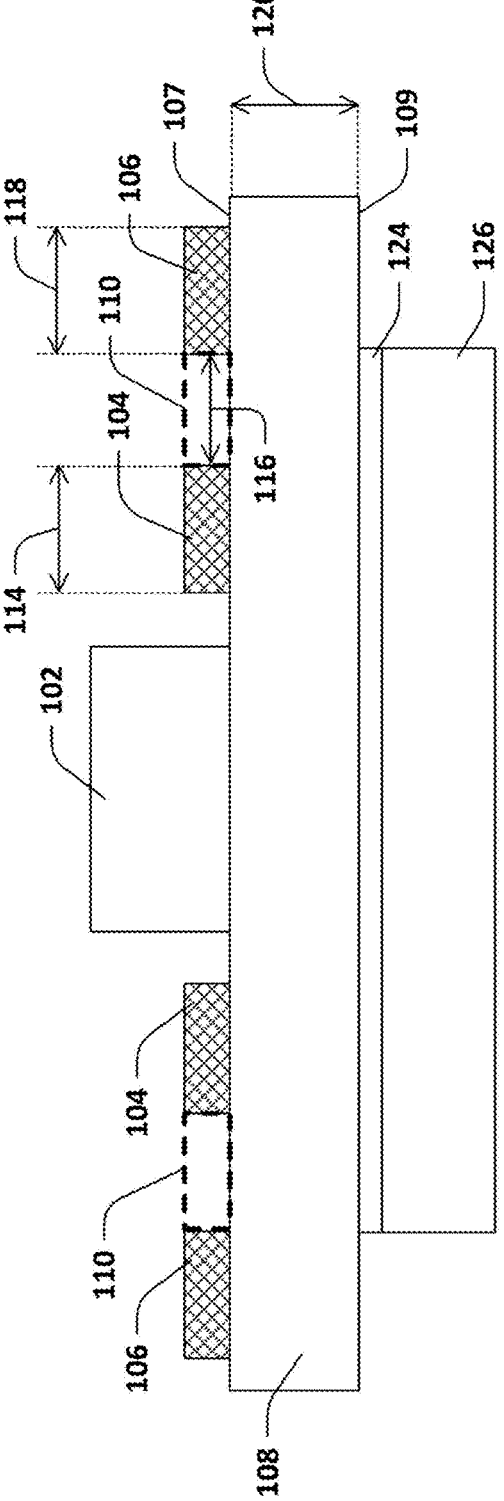
FIG. 1B illustrates a cross-sectional view of a conduit check apparatus, in accordance with some embodiments.
Figure 1C:
FIG. 1C illustrates a bottom view of a conduit check apparatus, in accordance with some embodiments.

FIGS. 1A-1C illustrate a conduit check apparatus 100 in accordance with some embodiments. FIG. 1A illustrates a top view of the conduit check apparatus 100 in accordance with some embodiments. FIG. 1B illustrates a cross-sectional view of the conduit check apparatus 100 taken along line B-B of FIG. 1A in accordance with some embodiments. FIG. 1C illustrates a bottom view of the conduit check apparatus 100 in accordance with some embodiments. In some embodiments, the conduit check apparatus 100 comprises at least one of a platform 108, a heating assembly, a thermochromic structure 126, or one or more other components. The platform 108 comprises a first side 107 (shown in FIGS. 1A and 1B) and a second side 109 (shown in FIGS. 1B and 1C) opposite the first side 107.

In some embodiments, the heating assembly comprises at least one of a first heater 104 (shown in FIGS. 1A and 1B), a second heater 106 (shown in FIGS. 1A and 1B), a temperature monitoring unit 102, or one or more other components. Although FIGS. 1A-1B illustrate an embodiment in which the heating assembly comprises two heaters, any number of heaters of the heating assembly are contemplated. In some embodiments, the heating assembly comprises at least two heaters. In some embodiments, some or all components of the heating assembly are coupled to the first side 107 of the platform 108. In some embodiments, each heater of one, some or all heaters of the heating assembly comprises at least one of a heating coil, an electrical coil, a resistor, electrical wire, etc. In some embodiments, at least two of an outer edge of the first heater 104, an inner edge of the first heater 104, an outer edge of the second heater 106, or an inner edge of the second heater 106 are at least one of circular, elliptical, or other shape. In some embodiments, at least two of the outer edge of the first heater 104, the inner edge of the first heater 104, the outer edge of the second heater 106, or the inner edge of the second heater 106 share about the same center point 134. In some embodiments, at least two of the outer edge of the first heater 104, the inner edge of the first heater 104, the outer edge of the second heater 106, or the inner edge of the second heater 106 form concentric objects, such as concentric circles or concentric ellipses.

In some embodiments, the second heater 106 at least one of surrounds, encircles, etc. at least some of the first heater 104. In some embodiments, a diameter 130 (shown in FIG. 1A) of the outer edge of the first heater 104 is less than a diameter 132 (shown in FIG. 1A) of the inner edge of the second heater 106 such that the first heater 104 is spaced apart from the second heater 106 by a separation region 110 (shown in FIGS. 1A and 1B). A length 116 (shown in FIGS. 1A and 1B) of the separation region 110 is at least one of (i) at least about 10 millimeters, or (ii) at least about 20 millimeters. In some embodiments, the length 116 of the separation region 110 corresponds to a difference between the diameter 130 of the outer edge of the first heater 104 and the diameter 132 of the inner edge of the second heater 106. A width 114 (shown in FIG. 1B) of the first heater 104 is at least one of (i) at least about 10 millimeters, or (ii) at least about 20 millimeters. A width 118 (shown in FIG. 1B) of the second heater 106 is at least one of (i) at least about 10 millimeters, or (ii) at least about 20 millimeters. Other values of the length 116, the width 114, and the width 118 are within the scope of the present disclosure.

In some embodiments, the temperature monitoring unit 102 is configured to measure a first temperature associated with the conduit check apparatus 100. In some embodiments, the first temperature corresponds to at least one of a temperature of the platform 108, a temperature of the thermochromic structure 126, or a temperature of an environment in which the conduit check apparatus 100 is disposed. In some embodiments, the temperature monitoring unit 102 is configured to display an indication of the first temperature via a temperature display 136 comprising at least one of a seven-segment display, a dot matrix display, a liquid crystal display (LCD), or other type of display. In some embodiments, the temperature monitoring unit 102 comprises a temperature control unit configured to monitor the first temperature and/or control at least one of the first heater 104 or the second heater 106 to achieve a predefined operating temperature. In some embodiments, in response to determining that the first temperature is less than the predefined operating temperature, the temperature control unit increases heat energy output of at least one of the first heater 104 or the second heater 106. In some embodiments, in response to determining that the first temperature is greater than the predefined operating temperature, the temperature control unit decreases heat energy output of at least one of the first heater 104 or the second heater 106. The predefined operating temperature during use of the conduit check apparatus 100 is at least one of (i) at most about 80 degrees Celsius, or (ii) at most about 60 degrees Celsius. Other values of the predefined operating temperature are within the scope of the present disclosure.

In some embodiments, the thermochromic structure 126 (shown in FIGS. 1B and 1C) comprises thermochromic material that changes color due to temperature change. The thermochromic structure 126 comprises at least one of thermochromic liquid crystal (TLC) or other suitable thermochromic material. In some embodiments, the TLC comprises an anisotropic liquid. The TLC possesses a mesophase (e.g., a phase with crystal and liquid properties) within one or more temperature ranges. In some embodiments, the thermochromic structure 126 comprises a sheet of BoPET (biaxially-oriented polyethylene terephthalate) at least partially covered with ink (on a single side of the sheet of BoPET, for example). In some embodiments, the ink, such as black ink, provides a dark background which absorbs light transmitted through the TLC and allows selectively reflected light (which is a function of temperature conditions, for example) to be viewed without light interference. In some embodiments, liquid crystal colors of the thermochromic structure 126 are viewed through the sheet of BoPET, and are indicative of temperature conditions. Other materials and configurations of the thermochromic structure 126 are within the scope of the present disclosure. In some embodiments, a region of the thermochromic structure 126 at least one of (i) exhibits a first color when a temperature of the region is in a first range of temperatures, (ii) exhibits a second color when a temperature of the region is in a second range of temperatures, or (iii) exhibits a third color when a temperature of the region is in a third range of temperatures. In some embodiments, at least one of the first color is red or the first range of temperatures ranges from at least about 33 degrees Celsius to at most about 34 degrees Celsius. In some embodiments, at least one of the second color is green or the second range of temperatures ranges from at least about 34 degrees Celsius to at most about 38 degrees Celsius. In some embodiments, at least one of the third color is blue or the third range of temperatures ranges corresponds to at least about 38 degrees Celsius. Other colors and/or temperature ranges associated with the thermochromic structure 126 are within the scope of the present disclosure.

In some embodiments, the thermochromic structure 126 is coupled to the second side 109 of the platform 108. In some embodiments, the thermochromic structure 126 is coupled to the second side 109 of the platform 108 via a layer 124 (shown in FIG. 1B). In some embodiments, the layer 124 comprises an adhesive that adheres the thermochromic structure 126 to the second side 109 of the platform 108. In some embodiments, the layer 124 comprises ultraviolet (UV)-cured resin. In some embodiments, the thermochromic structure 126 is coupled to the second side 109 of the platform 108 by at least one of (i) applying, such as painting and/or depositing, a UV-curable resin to the second side 109 of the platform 108, (ii) positioning the thermochromic structure 126 relative to the UV-curable resin such that the UV-curable resin is between and in contact with the thermochromic structure 126 and the platform 108, or (iii) while the UV-curable resin is between and in contact with the thermochromic structure 126 and the platform 108, applying UV light to the UV-curable resin to cure and/or solidify the UV-curable resin to form the UV-cured resin that adheres the thermochromic structure 126 to the second side 109 of the platform 108. In some embodiments, the UV light is emitted to the UV-curable resin through the platform 108. In some embodiments, the layer 124, such as the UV-cured resin, is configured to withstand temperatures greater than an operating temperature of the layer 124 during use of the conduit check apparatus 100. In some embodiments, using the UV-cured resin to support the thermochromic structure 126 increases at least one of a uniformity of the thermochromic structure 126 or a stability of a position of the thermochromic structure 126 relative to the platform 108, as compared with using other types of adhesives such as a temperature-curable adhesive that changes properties and/or reduces adhesion effectiveness as a result of temperatures to which the layer 124 is subjected during use of the conduit check apparatus 100.

In some embodiments, the platform 108 comprises at least one of glass, one or more polymers, or other suitable material. In some embodiments, the platform 108 comprises a transparent material to provide for visibility through at least a portion of the platform 108. A diameter 112 (shown in FIG. 1A) of the platform 108 is at least one of (i) at least about 150 millimeters, or (ii) at least about 300 millimeters. A thickness 120 (shown in FIG. 1B) of the platform 108 is at least one of (i) at most about 50 millimeters, (ii) between about 1 millimeter to about 20 millimeters, or (iii) between about 2 millimeters to about 10 millimeters. Other values of the diameter 112 and the thickness 120 are within the scope of the present disclosure.

Figure 2A:
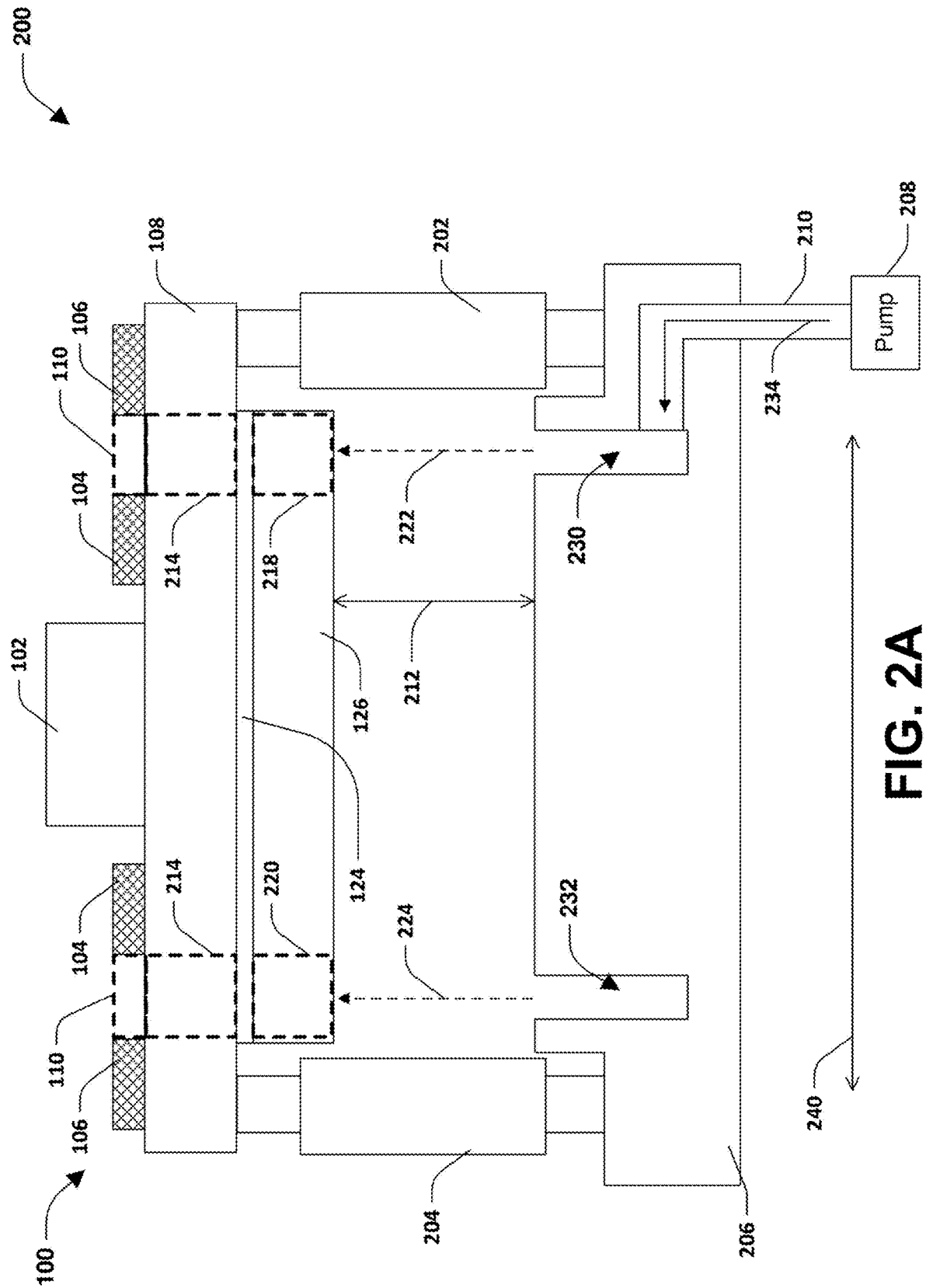
FIG. 2A illustrates a cross-sectional view of a conduit check apparatus in a conduit checking position relative to an electrostatic chuck, in accordance with some embodiments.
Figure 2B:
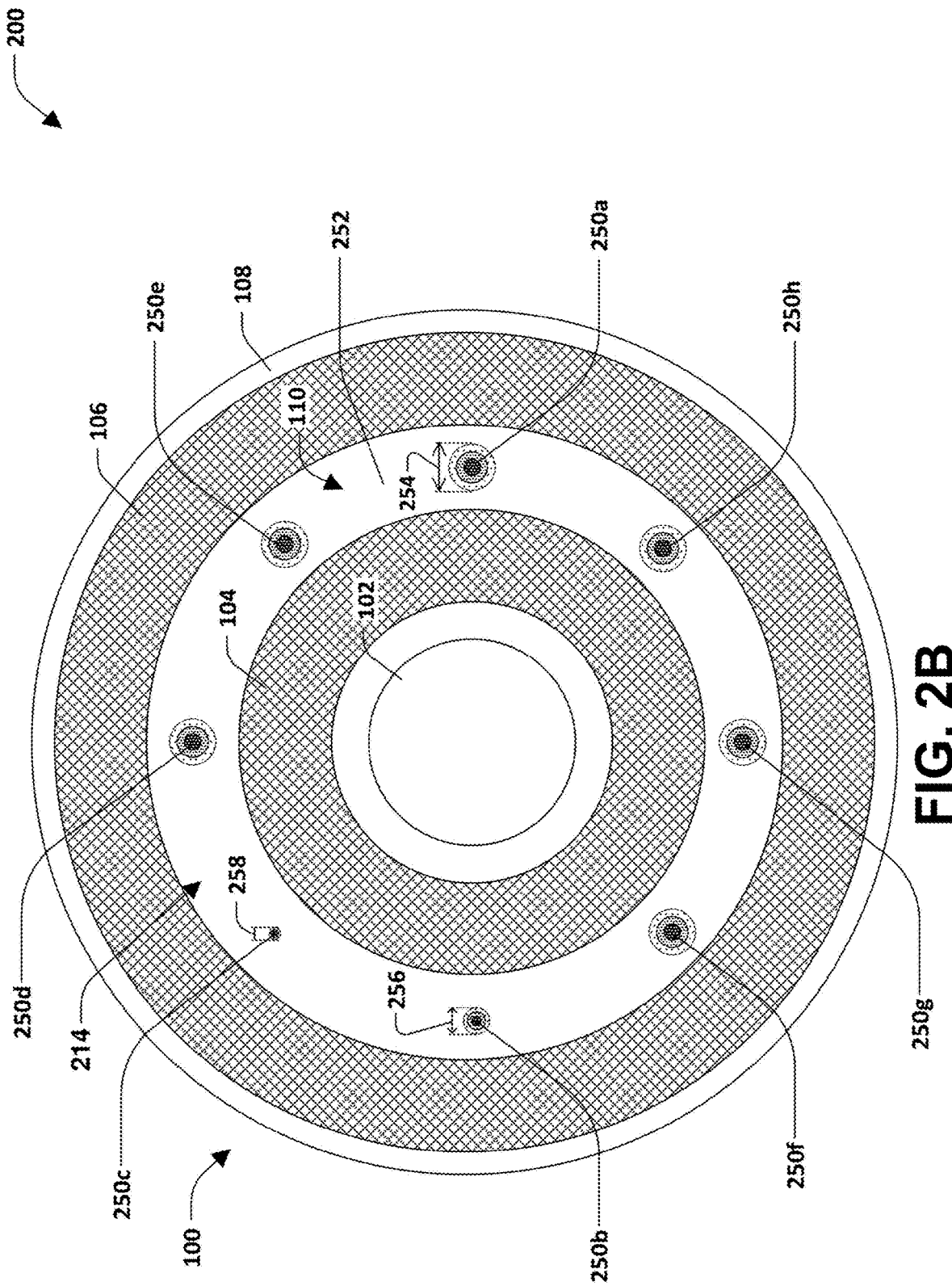
FIG. 2B illustrates a top view of a conduit check apparatus during a conduit status check, in accordance with some embodiments.

FIGS. 2A and 2B illustrate a system 200 comprising the conduit check apparatus 100 and an electrostatic chuck 206. The conduit check apparatus 100 is used to perform a conduit status check to determine a conduit status of a conduit defined by the electrostatic chuck 206, in accordance with some embodiments. In some embodiments, the conduit check apparatus 100 is positioned relative to the electrostatic chuck 206 (shown in FIGS. 2A and 3). FIG. 2A illustrates a cross-sectional view of the conduit check apparatus 100 and the electrostatic chuck 206 in accordance with some embodiments. In some embodiments, the conduit check apparatus 100 comprises a positioning assembly for positioning the conduit check apparatus 100 in a conduit testing position relative to the electrostatic chuck 206. FIG. 2A depicts the conduit check apparatus 100 in the conduit testing position. In some embodiments, the positioning assembly comprises at least one of a first leveling jig 202, a second leveling jig 204, or one or more other components. In some embodiments, the first leveling jig 202 and the second leveling jig 204 are installed and/or placed upon the electrostatic chuck 206, and the platform 108 is installed and/or placed upon the first leveling jig 202 and the second leveling jig 204. At least one of the first leveling jig 202 or the second leveling jig 204 comprises at least one of one or more metals, one or more polymers, or other suitable material. In some embodiments, a length of at least one of the first leveling jig 202 or the second leveling jig 204 is configured to provide a separation distance 212 between the thermochromic structure 126 and the electrostatic chuck 206 when the conduit check apparatus 100 is in the conduit testing position. The separation distance 212 is at least one of (i) at most about 2 centimeters, (ii) at most about 1 centimeter, or (iii) at most about 15 millimeters. Other values of the separation distance 212 are within the scope of the present disclosure.

In some embodiments, the electrostatic chuck 206 comprises a set of conduits comprising at least one of a first conduit 230 (shown in FIGS. 2A and 3), a second conduit 232 (shown in FIGS. 2A and 3), a third conduit 308 (shown in FIG. 3), a fourth conduit 310, a fifth conduit 312, a sixth conduit 304, a seventh conduit 302, or an eighth conduit 316. Other quantities of conduits of the set of conduits are within the scope of the present disclosure, such as between one conduit to 20 conduits, or more than 20 conduits.

In some embodiments, during the conduit status check, a pump 208 conducts a gas 234 to the set of conduits via one or more channels. In some embodiments, the gas 234 comprises at least one of air, clean dry air (CDA), or other gas. In some embodiments, each conduit of one, some or all of the set of conduits is configured to emit at least some of the gas 234 received via the one or more channels. In some embodiments, the one or more channels comprise a channel 210 and one or more internal channels (not shown) extending through the electrostatic chuck 206 to connect to the set of conduits.

In some embodiments, the thermochromic structure 126 is positioned relative to a flow path associated with each conduit of one, some, or all of the set of conduits. In some embodiments, the thermochromic structure 126 comprises a set of regions comprising at least one of a first region 218 positioned relative to a first flow path 222 of first gas emitted from the first conduit 230, a second region 220 positioned relative to a second flow path 224 of second gas emitted from the second conduit 232, a third region (not shown) positioned relative to a third flow path (not shown) of third gas emitted from the third conduit 308, a fourth region (not shown) positioned relative to a fourth flow path (not shown) of fourth gas emitted from the fourth conduit 310, a fifth region (not shown) positioned relative to a fifth flow path (not shown) of fifth gas emitted from the fifth conduit 312, a sixth region (not shown) positioned relative to a sixth flow path (not shown) of sixth gas emitted from the sixth conduit 304, a seventh region (not shown) positioned relative to a seventh flow path (not shown) of seventh gas emitted from the seventh conduit 302, or an eighth region (not shown) positioned relative to an eighth flow path (not shown) of eighth gas emitted from the eighth conduit 316. In some embodiments, at least one of the first region 218 of the thermochromic structure 126 overlies the first conduit 230, the second region 220 overlies the second conduit 232, the second region 220 overlies the second conduit 232 etc.

In some embodiments, during the conduit status check and/or while gas is emitted from the set of conduits, the heating assembly heats at least a portion of the conduit check apparatus 100 based upon the predefined operating temperature. In some embodiments, the first gas flowing (along the first flow path 222) towards and/or impinging upon the first region 218 of the thermochromic structure 126 causes a first temperature change of the first region 218. In some embodiments, the first temperature change causes a first color change of the first region 218, such as due, at least in part, to thermochromic properties of the thermochromic structure 126. The first color change corresponds to a change from the first region 218 having a first color pattern to having a second color pattern. In some embodiments, the first temperature change corresponds to a temperature decrease of the first region 218. In some embodiments, a magnitude of the first temperature change is dependent upon a first rate with which the first gas at least one of is emitted from the first conduit 230 or impinges upon the first region 218 of the thermochromic structure 126, such as where (i) an increase of the first rate corresponds to a greater magnitude of the first temperature change (e.g., a greater decrease in temperature) and (ii) a decrease of the first rate corresponds to a lesser magnitude of the first temperature change (e.g., a lesser decrease in temperature). In some embodiments, the first rate is dependent upon a first blockage level of the first conduit 230. In some embodiments, the first blockage level corresponds to a degree with which the first conduit 230 is blocked and/or obstructed by particles including at least one of contaminants, polymers, etc. Thus, in accordance with some embodiments, the first blockage level can be discerned from the first color change and/or the second color pattern of the first region 218, such as due, at least in part, to the first blockage level impacting the first rate which impacts the first color change and/or the second color pattern of the first region 218.

In some embodiments, the second gas flowing (along the second flow path 224) towards and/or impinging upon the second region 220 of the thermochromic structure 126 causes a second temperature change of the second region 220. In some embodiments, the second temperature change causes a second color change of the second region 220, such as due, at least in part, to thermochromic properties of the thermochromic structure 126. The second color change corresponds to a change from the second region 220 having a third color pattern to having a fourth color pattern. In some embodiments, the second temperature change corresponds to a temperature decrease of the second region 220. In some embodiments, a magnitude of the second temperature change is dependent upon a second rate with which the second gas at least one of is emitted from the second conduit 232 or impinges upon the second region 220 of the thermochromic structure 126, such as where (i) an increase of the second rate corresponds to a greater magnitude of the second temperature change (e.g., a greater decrease in temperature) and (ii) a decrease of the second rate corresponds to a lesser magnitude of the second temperature change (e.g., a lesser decrease in temperature). In some embodiments, the second rate is dependent upon a second blockage level of the second conduit 232. In some embodiments, the second blockage level corresponds to a degree with which the second conduit 232 is blocked and/or obstructed by particles including at least one of contaminants, polymers, etc. Thus, in accordance with some embodiments, the second blockage level can be discerned from the second color change and/or the fourth color pattern of the second region 220, such as due, at least in part, to the second blockage level impacting the second rate which impacts the second color change and/or the fourth color pattern of the second region 220.

In some embodiments, along an axis 240 (shown in FIG. 2A), the first heater 104 and the second heater 106 are offset from the first region 218. In some embodiments, the first region 218 is between the first heater 104 and the second heater 106 along the axis 240. In some embodiments, the separation region 110 overlies the first region 218. In some embodiments, the first region 218 being between the first heater 104 and the second heater 106 (along the axis 240) provides for improved temperature control of the first region 218 by the heating assembly in such a way that allows the first region 218 to be visible (to at least one of a technician, a robot, a camera, etc.) from a location above the platform 108 and/or the conduit check apparatus 100. In some embodiments, the separation region 110 overlies a display region 214 (shown in FIGS. 2A and 2B) of the platform 108. In some embodiments, one, some or all of the set of regions are visible (to at least one of a technician, a robot, a camera, etc.) from a location above the platform 108 and/or the conduit check apparatus 100 due to at least one of (i) the separation region 110 comprising at least one of empty space, air, a transparent material, etc. to allow visibility of the display region 214 through the separation region 110, (ii) at least some of the display region 214 being transparent to allow visibility through the display region 214 of the platform 108, or (iii) the layer 124 being transparent to allow visibility through the layer 124. In some embodiments, the display region 214 of the platform 108 corresponds to a region, of the platform 108, that is between the first heater 104 and the second heater 106.

FIG. 2B illustrates a top view of the conduit check apparatus 100 during the conduit status check, in accordance with some embodiments. In some embodiments, the thermochromic structure 126 produces a set of visual indications (e.g., a set of one or more visual indications) of a set of conduit statuses of the set of conduits. In some embodiments, each region of one, some, or all of the set of regions produces a visual indication of the set of visual indications. As shown in FIG. 2B the set of visual indications are visible (through (i) the separation region 110 between the first heater 104 and the second heater 106 and (ii) the display region 214, of the platform 108, underlying the separation region 110) from the top view of the conduit check apparatus 100 such that the set of visual indications are visible (to at least one of a technician, a robot, a camera, etc.) from a location above the platform 108 and/or the conduit check apparatus 100, in accordance with some embodiments.

In some embodiments, the set of visual indications comprises at least one of (i) a first visual indication 250a, of a first conduit status of the first conduit 230, produced by the first region 218 (shown in FIG. 2A) of the thermochromic structure 126, (ii) a second visual indication 250b, of a second conduit status of the second conduit 232, produced by the second region 220 (shown in FIG. 2A) of the thermochromic structure 126, (iii) a third visual indication 250c, of a third conduit status of the third conduit 308, produced by the third region of the thermochromic structure 126, (iv) a fourth visual indication 250d, of a fourth conduit status of the fourth conduit 310, produced by the fourth region of the thermochromic structure 126, (v) a fifth visual indication 250e, of a fifth conduit status of the fifth conduit 312, produced by the fifth region of the thermochromic structure 126, (vi) a sixth visual indication 250f, of a sixth conduit status of the sixth conduit 304, produced by the sixth region of the thermochromic structure 126, (vii) a seventh visual indication 250g, of a seventh conduit status of the seventh conduit 302, produced by the seventh region of the thermochromic structure 126, or (viii) an eighth visual indication 250h, of an eighth conduit status of the eighth conduit 316, produced by the eighth region of the thermochromic structure 126.

In some embodiments, the first visual indication 250a corresponds to the second color pattern of the first region 218. In some embodiments, one or more colors of the first visual indication 250a are different than a color of a portion 252 of the thermochromic structure 126 that is outside the set of regions of the thermochromic structure 126 (that produce the set of visual indications). In some embodiments, the difference in color between the first visual indication 250a and the portion 252 is due, at least in part, to the first gas emitted from the first conduit 230 having a greater temperature reduction impact (e.g., the first temperature change) on the first region 218 than on the portion 252 that is outside the first region 218. In some embodiments, the first conduit status corresponds to at least one of the first blockage level of the first conduit 230 or the first rate associated with the first conduit 230. In some embodiments, the first conduit status is indicated by (i) a first size 254 of the first visual indication 250a, (ii) one or more color intensities of one or more colors of the first visual indication 250a, (iii) an extent by which a color of the first visual indication 250a differs from the color of the portion 252, or (iv) one or more other features of the first visual indication 250a.

In some embodiments, the second visual indication 250b corresponds to the fourth color pattern of the second region 220. In some embodiments, one or more colors of the second visual indication 250b are different than the color of the portion 252. In some embodiments, the difference in color between the second visual indication 250b and the portion 252 is due, at least in part, to the second gas emitted from the second conduit 232 having a greater temperature reduction impact (e.g., the second temperature change) on the second region 220 than on the portion 252 that is outside the second region 220. In some embodiments, the second conduit status corresponds to at least one of the second blockage level of the second conduit 232 or the second rate associated with the second conduit 232. In some embodiments, the second conduit status is indicated by (i) a second size 256 of the second visual indication 250b, (ii) one or more color intensities of one or more colors of the second visual indication 250b, (iii) an extent by which a color of the second visual indication 250b differs from the color of the portion 252, or (iv) one or more other features of the second visual indication 250b.

In some embodiments, other visual indications of the set of visual indications are produced using one or more of the techniques provided herein with respect to the first visual indication 250a and the second visual indication 250b. In some embodiments, other visual indications of the set of visual indications have one, some, or all of the features, properties, etc. provided herein with respect to the first visual indication 250a and the second visual indication 250b.

In some embodiments, the first size 254 of the first visual indication 250a indicates that the first blockage level of the first conduit 230 is less than a first threshold blockage level (and/or that the first conduit 230 is relatively clean and does not require cleaning). In some embodiments, the first blockage level of the first conduit 230 being less than the first threshold blockage level (and/or the first visual indication 250a having the first size 254) indicates that the first conduit 230 at least one of (i) is relatively clean and/or has zero blockage or a light degree of blockage, (ii) does not require cleaning prior to using the electrostatic chuck 206 to process a semiconductor wafer, or (iii) is sufficiently clean for use in processing a semiconductor wafer. In some embodiments, the second size 256 of the second visual indication 250b being smaller than the first size 254 indicates that the second blockage level of the second conduit 232 is less than the first blockage level of the first conduit 230. In some embodiments, the second size 256 of the second visual indication 250b indicates that the second blockage level of the second conduit 232 is between the first threshold blockage level and a second threshold blockage level greater than the first threshold blockage level. In some embodiments, the second blockage level of the second conduit 232 being between the first threshold blockage level and the second threshold blockage level (and/or the second visual indication 250b having the second size 256) indicates that the second conduit 232 at least one of (i) has a medium degree of blockage, (ii) requires cleaning prior to using the electrostatic chuck 206 to process a semiconductor wafer to avoid damaging the semiconductor wafer, or (iii) does not require cleaning prior to using the electrostatic chuck 206 to process a semiconductor wafer. In some embodiments, a third size 258 of the third visual indication 250c being smaller than the second size 256 indicates that a third blockage level of the third conduit 308 is less than the second blockage level of the second conduit 232. In some embodiments, the third size 258 of the third visual indication 250c indicates that the third blockage level of the third conduit 308 is greater than the second threshold blockage level. In some embodiments, the third blockage level of the third conduit 308 being greater than the second threshold blockage level (and/or the third visual indication 250c having the third size 258) indicates that the third conduit 308 at least one of (i) has a critical degree of blockage, or (ii) requires cleaning prior to using the electrostatic chuck 206 to process a semiconductor wafer to avoid damaging the semiconductor wafer.

In some embodiments, the conduit check apparatus 100 comprises (i) a camera configured to capture an image of the set of visual indications, and (ii) a computing system configured to perform image processing on the image to determine the set of conduit statuses of the set of conduits. In some embodiments, in response to identifying a conduit (e.g., the second conduit 232) with a medium degree of blockage and/or a conduit (e.g., the third conduit 308) with a critical degree of blockage, the computing system provides an alert to a maintenance unit. In some embodiments, the alert instructs the maintenance unit to allocate one or more resources (e.g., a robot, manpower, etc.) to at least one of (i)

clean one or more conduits of the set of conduits of the electrostatic chuck 206, (ii) repair and/or refurbish the electrostatic chuck 206, or (iii) replace the electrostatic chuck 206 with a new electrostatic chuck. Thus, using one or more of the techniques provided herein, problematic electrostatic chucks with at least partially clogged conduits can be detected and/or repaired, replaced, etc. more quickly and/or with fewer resources (e.g., manpower, tools, time, etc.). In some embodiments, a technician manually inspects the set of visual indications to determine the set of conduit statuses of the set of conduits.

Figure 3:
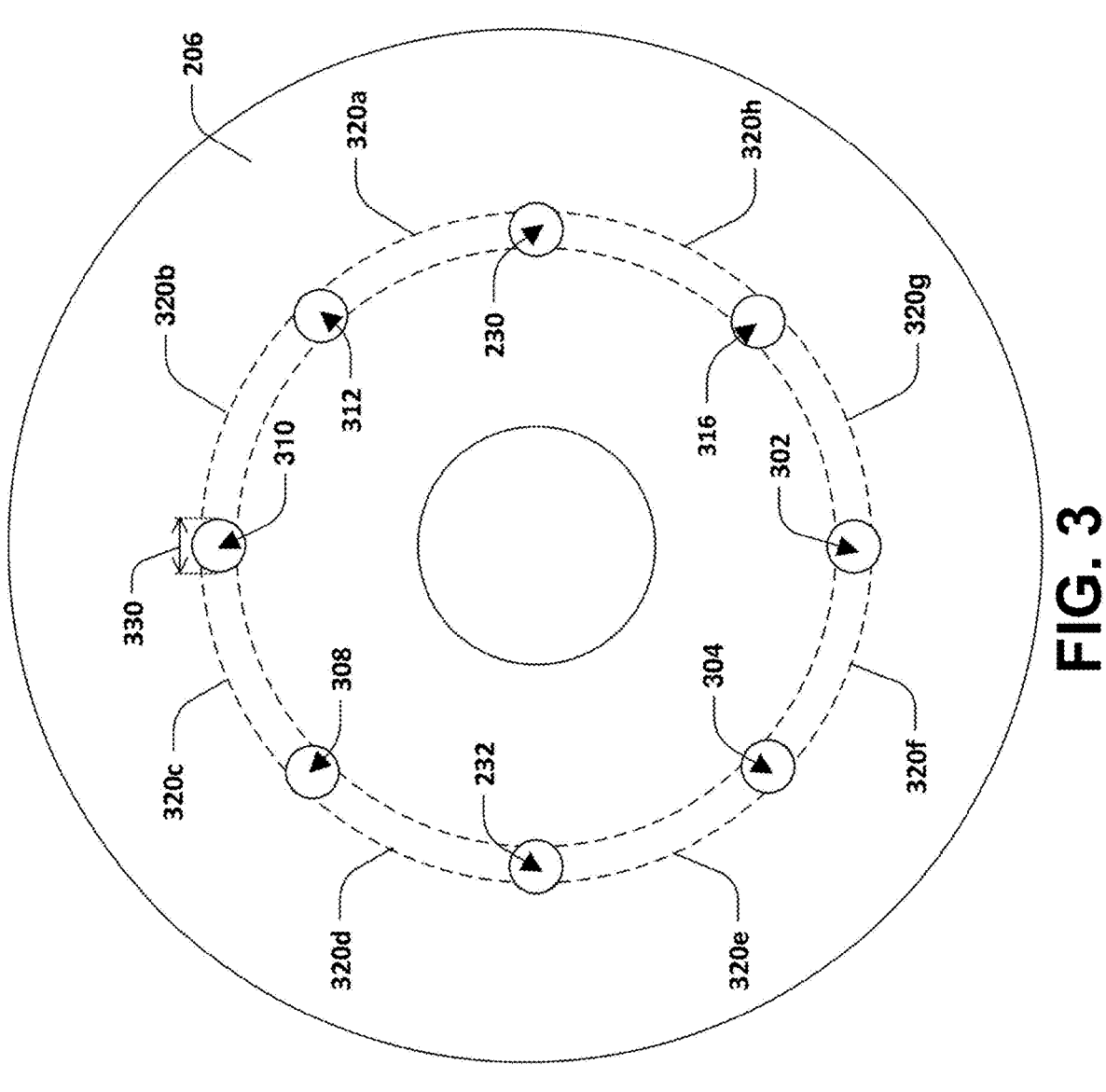
FIG. 3 illustrates a top view of an electrostatic chuck, in accordance with some embodiments.

FIG. 3 illustrates a top view of the electrostatic chuck 206, in accordance with some embodiments. A diameter 330 of each conduit of one, some, or all of the set of conduits is at least one of (i) at most about 10 millimeters, (ii) at most about 5 millimeters, or (iii) at most about 3 millimeters. Other values of the diameter 330 are within the scope of the present disclosure. In some embodiments, the gas 234 (shown in FIG. 2A) is conducted to the set of conduits via one or more internal channels comprising at least one of a channel 320a, a channel 320b, a channel 320c, a channel 320d, a channel 320e, a channel 320f, a channel 320g, a channel 320h, etc. In some embodiments, channels 320a-320h are not visible from the top view of the electrostatic chuck 206, but are shown in FIG. 3 with dashed-line outlines.

Figure 4A:
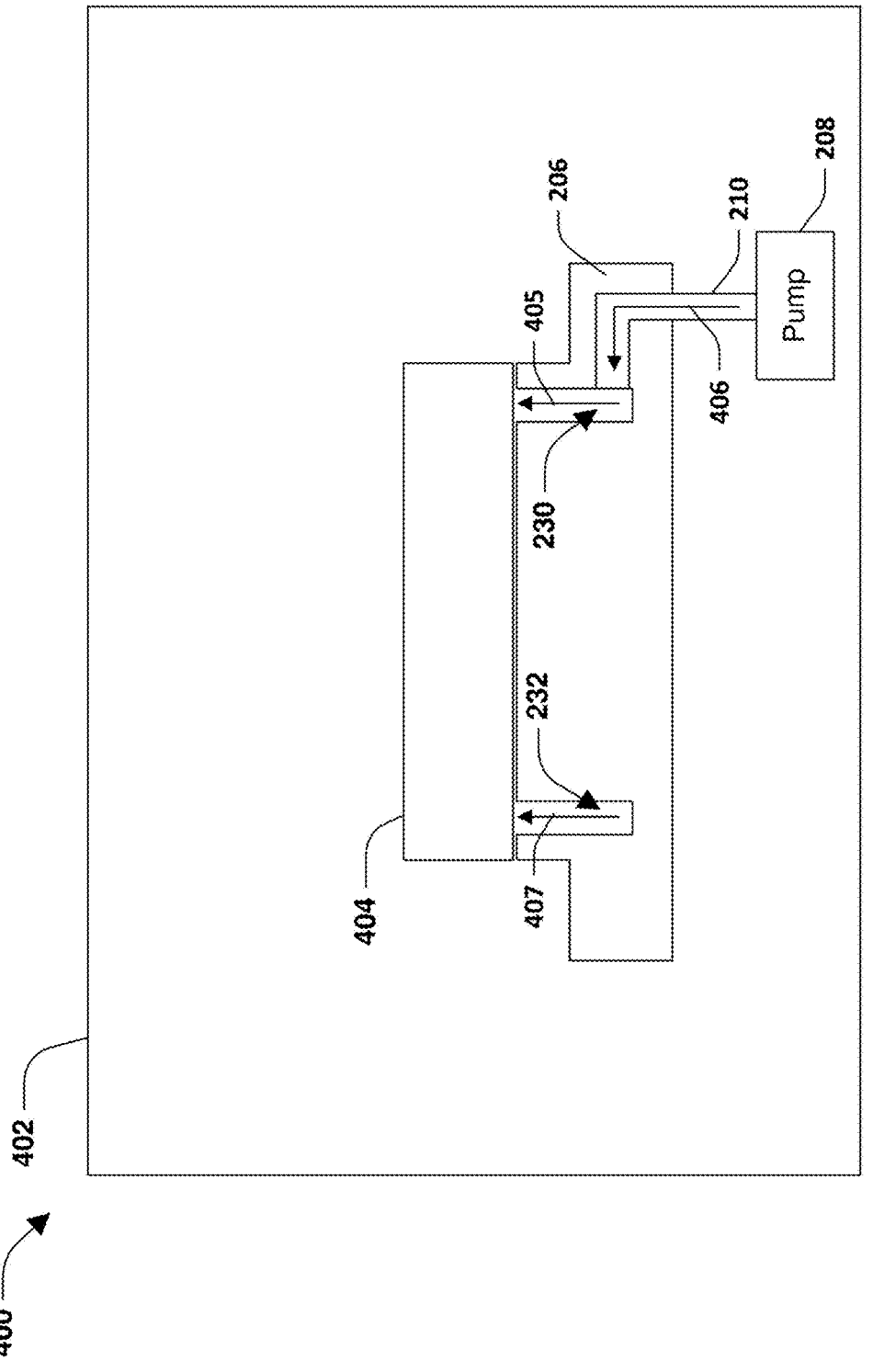
FIG. 4A illustrates an electrostatic chuck retaining a semiconductor wafer, in accordance with some embodiments.
Figure 4B:
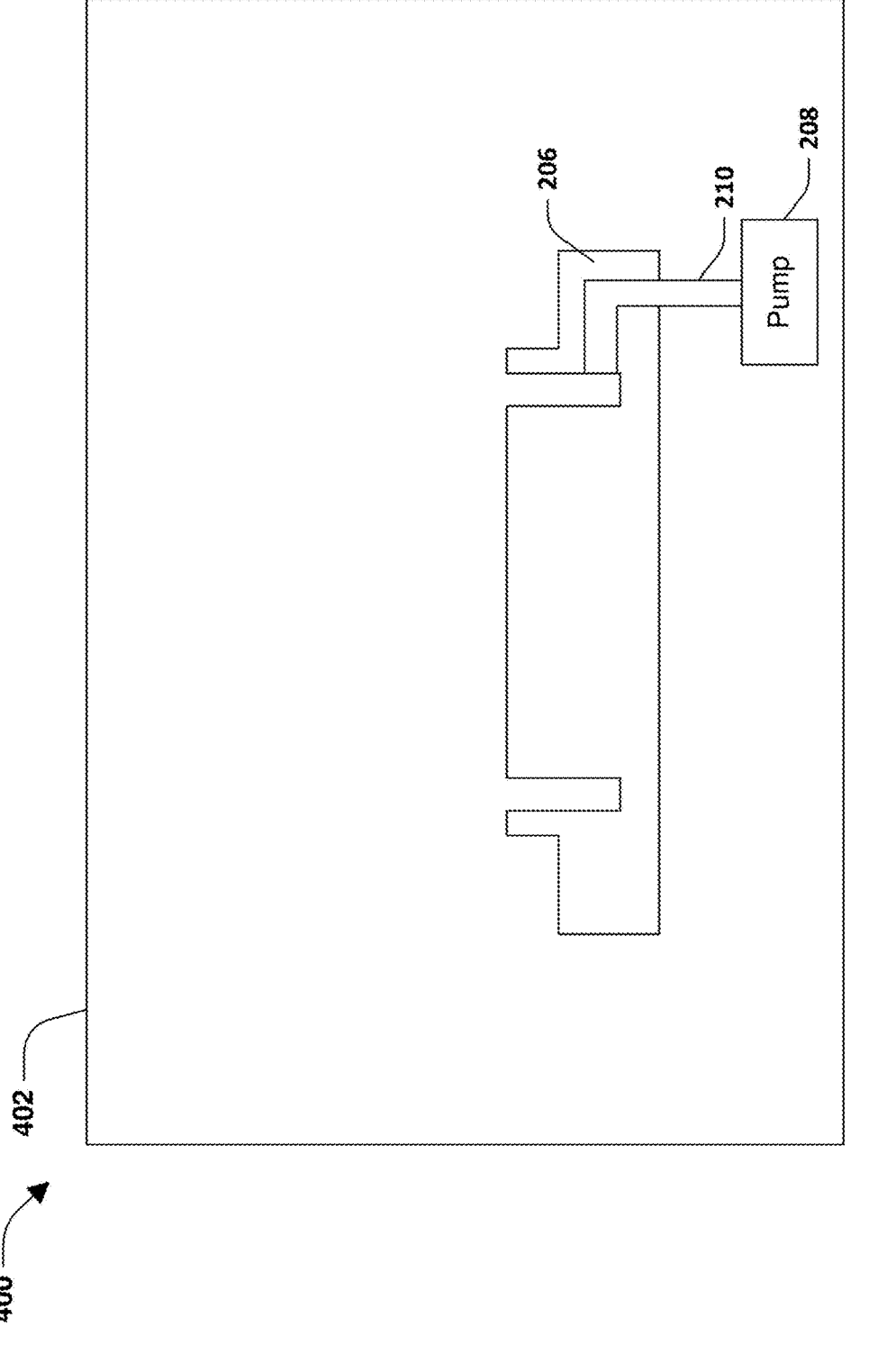
FIG. 4B illustrates removal of a semiconductor wafer from a processing chamber in which an electrostatic chuck is disposed, in accordance with some embodiments.
Figure 4C:
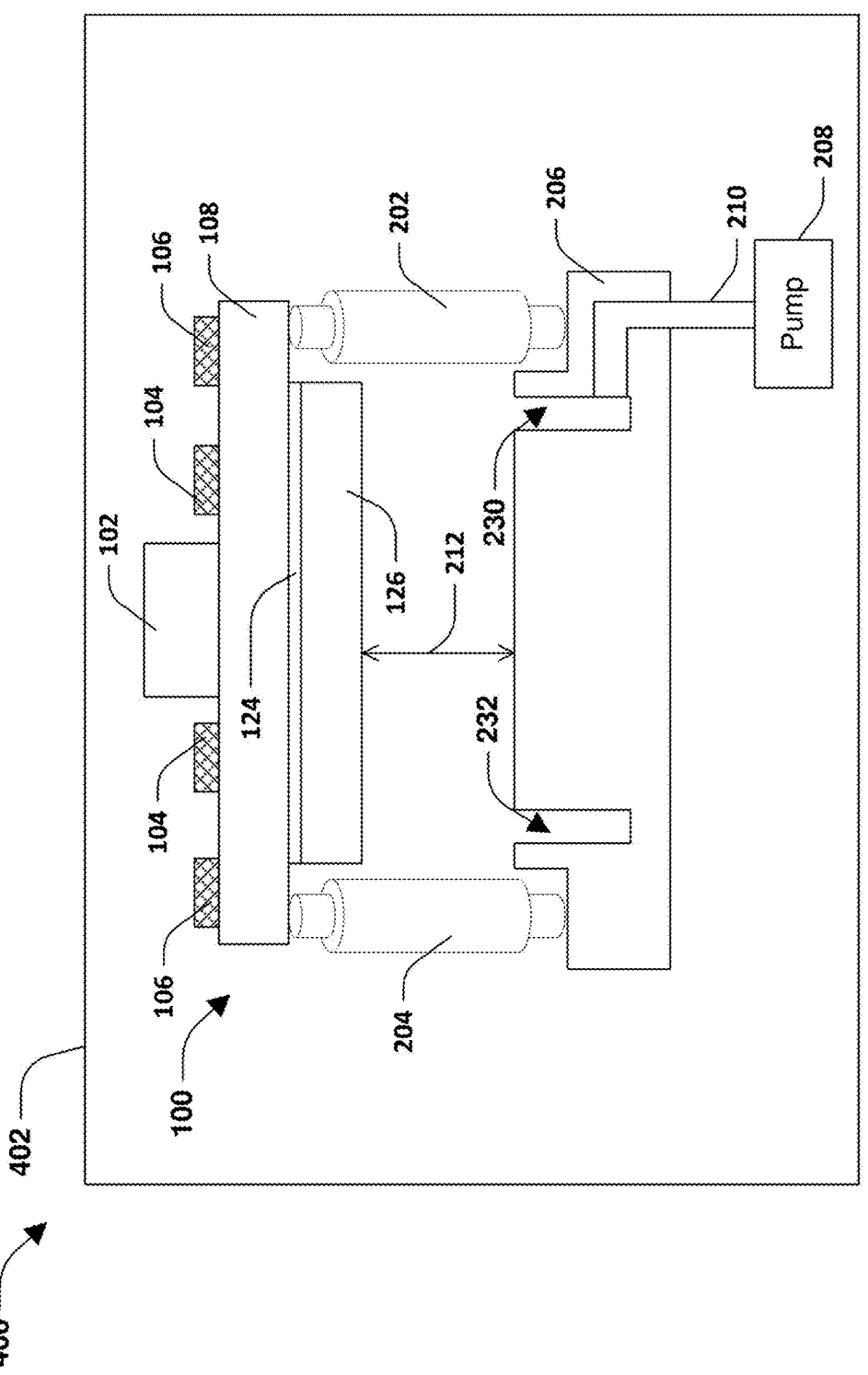
FIG. 4C illustrates transfer of a conduit check apparatus to a processing chamber in which an electrostatic chuck is disposed, in accordance with some embodiments.

FIGS. 4A-4C illustrate a scenario 400 in which the conduit check apparatus 100 is transferred to a processing chamber 402 in which the electrostatic chuck 206 is disposed to perform the conduit status check, in accordance with some embodiments. FIG. 4A illustrates the electrostatic chuck 206 being used in association with a semiconductor fabrication process performed on a semiconductor wafer 404, in accordance with some embodiments. In some embodiments, the electrostatic chuck 206 is configured to retain the semiconductor wafer 404 in a target position, such as the position of the semiconductor wafer 404 shown in FIG. 4A, while the semiconductor fabrication process is performed. In some embodiments, the semiconductor wafer 404 comprises at least one of a substrate, a photomask, a semiconductor device, a die, etc. In some embodiments, the electrostatic chuck 206 comprises one or more electrodes (not shown) that are biased with a voltage to establish an electrostatic holding force between the electrostatic chuck 206 and the semiconductor wafer 404 to retain (e.g., clamp, hold, support, chuck, etc.) the semiconductor wafer in the target position.

In some embodiments, the processing chamber 402 is defined by one or more walls of a processing station configured to perform the semiconductor fabrication process on the semiconductor wafer 404 to produce a processed semiconductor wafer. In some embodiments, the processing station performs the semiconductor fabrication process on the semiconductor wafer 404 while the semiconductor wafer 404 is retained by the electrostatic chuck 206 in the processing chamber 402. In some embodiments, the processing station comprises at least one of (i) ion implantation equipment, (ii) chemical vapor deposition (CVD) equipment, (iii) physical vapor deposition (PVD) equipment, (iv) etching equipment, such as at least one of plasma etching equipment, wet etching equipment, dry etching equipment, reactive-ion etching (RIE) equipment, atomic layer etching (ALE) equipment, buffered oxide etching equipment, or ion beam milling equipment, (v) lithography equipment, (vi) chemical mechanical planarization (CMP) equipment, (vii) plating equipment, (viii) cleaning equipment, (ix) a furnace, such as a semiconductor furnace tool, or (x) other equipment. In some embodiments, the semiconductor fabrication process comprises at least one of an ion implantation process, a PVD process, a plating process, an etching process, a lithography process, a CMP process, a CVD process, a thermal process, a cleaning process, or other process.

In some embodiments, while the semiconductor wafer 404 is retained in the target position (and/or while the semiconductor fabrication process is performed on the semiconductor wafer 404), the pump 208 conducts a gas 406 to the set of conduits via one or more channels. In some embodiments, the gas 406 comprises at least one of an inert gas, helium, a gas with thermal conductivity higher than a threshold thermal conductivity, or other suitable gas. Conduits of the set of conduits may also be referred to as "helium holes". In some embodiments, each conduit of one, some, or all of the set of conduits is configured to emit at least some of the gas 406 towards the semiconductor wafer 404. In some embodiments, at least one of the first conduit 230 emits a first portion 405 of the gas 406 to the semiconductor wafer 404, the second conduit 232 emits a second portion 407 of the gas 406 to the semiconductor wafer 404, etc. In some embodiments, the gas 406 emitted from the set of conduits during the semiconductor fabrication process is different than the gas 234 emitted from the set of conduits during the conduit status check. In some embodiments, the gas 406 is emitted from the set of conduits during the semiconductor fabrication process for at least one of (i) cooling (e.g., backside cooling) or heating of the semiconductor wafer 404, (ii) monitoring chuck performance (e.g., clamp performance) of the electrostatic chuck 206 (e.g., leak-by flow of the gas 406 is measured as a gauge for chuck performance of the electrostatic chuck 206), (iii) heat transfer between the electrostatic chuck 206 and the semiconductor wafer 404, (iv) controlling a temperature of the semiconductor wafer 404, or (v) one or more other purposes.

In some embodiments, responsive to performing the semiconductor fabrication process on the semiconductor wafer 404 to produce the processed semiconductor wafer, the electrostatic chuck 206 releases the processed semiconductor wafer, such as by de-energizing the one or more electrodes. In some embodiments, when the processed semiconductor wafer is released by the electrostatic chuck 206, the processed semiconductor wafer is removed from the processing chamber 402. FIG. 4B illustrates removal of the processed semiconductor wafer from the processing chamber 402, in accordance with some embodiments. In some embodiments, subsequent to removing the processed semiconductor wafer from the processing chamber 402, the conduit check apparatus 100 is transferred to the processing chamber 402 in which the electrostatic chuck 206 is disposed and the conduit check apparatus 100 is positioned in the conduit testing position relative to the electrostatic chuck 206. FIG. 4C illustrates positioning the conduit check apparatus 100 in the conduit testing position relative to the electrostatic chuck 206, in accordance with some embodiments. In some embodiments, the conduit status check is performed using the conduit check apparatus 100 when the conduit check apparatus 100 is positioned in the conduit testing position relative to the electrostatic chuck 206.

Embodiments are contemplated in which the electrostatic chuck 206 is used to retain a non-semiconductor wafer object in addition or as an alternative to being used to retain the semiconductor wafer 404. In some embodiments, the non-semiconductor wafer object comprises a workpiece that while retained by the electrostatic chuck 206, undergoes a process to form a product from the workpiece. In some embodiments, the electrostatic chuck 206 retains and/or interacts with the non-semiconductor wafer object using one or more of the techniques provided herein with respect to the semiconductor wafer 404.

Embodiments are contemplated in which the electrostatic chuck 206 is replaced with a tool, other than an electrostatic chuck, that comprises one or more conduits. In some embodiments, the conduit check apparatus 100 is used to determine one or more conduit statuses of the one or more conduits of the (non-electrostatic chuck) tool, such as using one or more of the techniques provided herein with respect to determining the conduit statuses of conduits of the electrostatic chuck 206.

A method 500 of identifying a conduit status of a conduit, is illustrated in FIG. 5 in accordance with some embodiments. At 502, a conduit check apparatus is positioned relative to an electrostatic chuck, wherein the conduit check apparatus comprises a thermochromic structure. In some embodiments at least one of (i) the conduit check apparatus comprises the conduit check apparatus 100, (ii) the electrostatic chuck comprises the electrostatic chuck 206, or (iii) the thermochromic structure comprises the thermochromic structure 126. In some embodiments, the conduit check apparatus is positioned in a conduit testing position relative to the electrostatic chuck, such as using a positioning assembly (e.g., the first leveling jig 202 and/or the second leveling jig 204). At 504, a first gas is emitted from a first conduit defined by the electrostatic chuck towards a first region of the thermochromic structure. In some embodiments, at least one of (i) the first conduit comprises the first conduit 230, or (ii) the first region comprises the first region 218. At 506, a first visual indication of a first conduit status of the first conduit is produced at the first region of the thermochromic structure. In some embodiments, the first visual indication comprises the first visual indication 250*a*.

Figure 6:
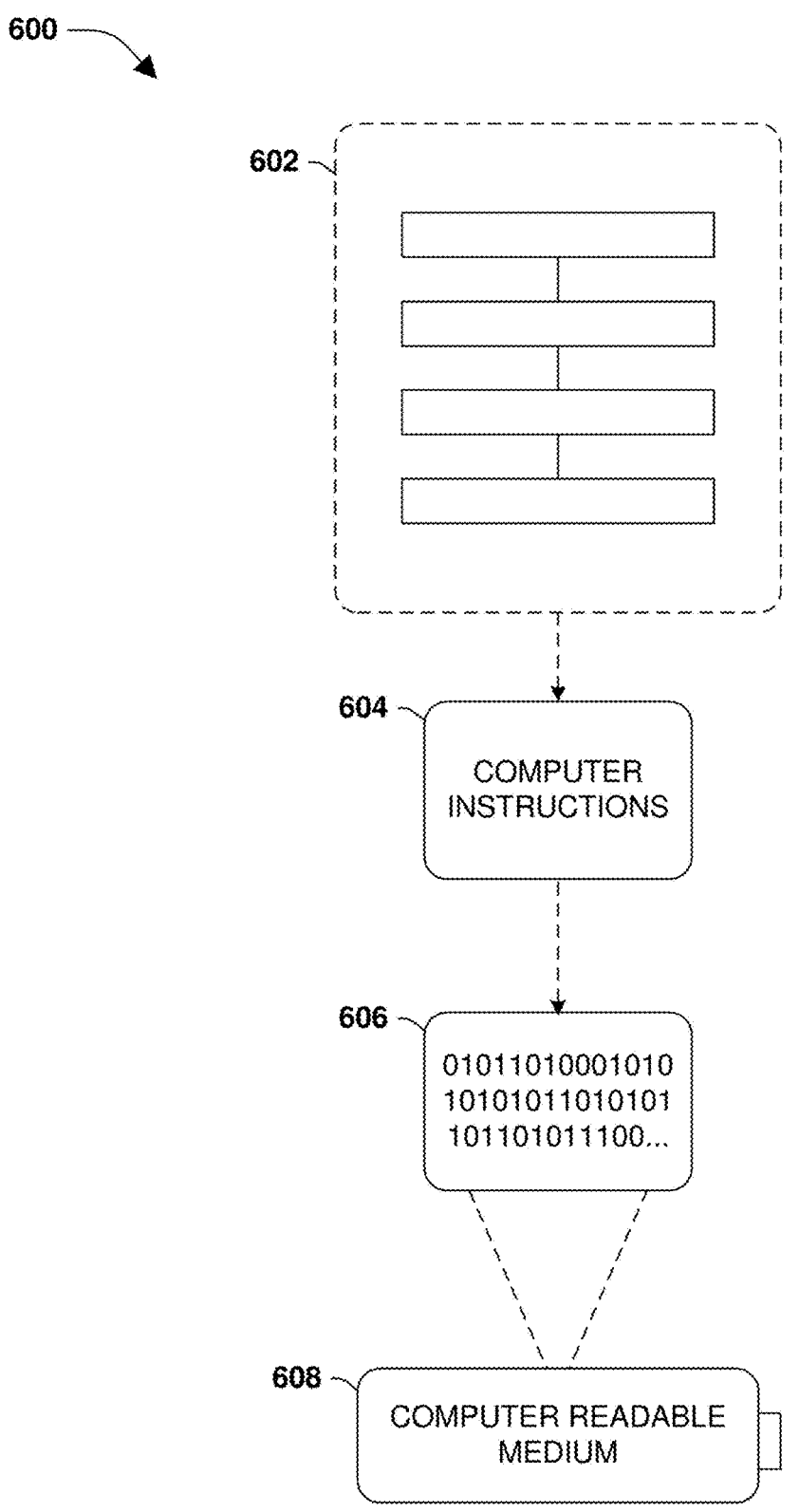
FIG. 6 illustrates an example computer-readable medium wherein processor-executable instructions configured to embody one or more of the provisions set forth herein may be comprised, according to some embodiments.

One or more embodiments involve a computer-readable medium comprising processor-executable instructions configured to implement one or more of the techniques presented herein. An exemplary computer-readable medium is illustrated in FIG. 6, wherein the embodiment 600 comprises a computer-readable medium 608 (e.g., a CD-R, DVD-R, flash drive, a platter of a hard disk drive, etc.), on which is encoded computer-readable data 606. This computer-readable data 606 in turn comprises a set of processor-executable computer instructions 604 configured to implement one or more of the principles set forth herein when executed by a processor. In some embodiments 600, the processor-executable computer instructions 604 are configured to implement a method 602, such as at least some of the aforementioned method(s) when executed by a processor. In some embodiments, the processor-executable computer instructions 604 are configured to implement a system, such as at least some of the one or more aforementioned system(s) when executed by a processor. Many such computer-readable media may be devised by those of ordinary skill in the art that are configured to operate in accordance with the techniques presented herein.

In some embodiments, a system is provided. The system includes an electrostatic chuck defining a first conduit configured to emit a first gas. The system includes a conduit check apparatus for identifying a first conduit status of the first conduit. The conduit check apparatus includes a thermochromic structure including a first region positioned relative to a flow path of the first gas emitted from the first conduit. The first region of the thermochromic structure produces a first visual indication of the first conduit status.

In some embodiments, a method is provided. The method includes positioning a conduit check apparatus relative to an electrostatic chuck. The conduit check apparatus includes a thermochromic structure. The method includes emitting, from a first conduit defined by the electrostatic chuck, a first gas towards a first region of the thermochromic structure. The method includes producing a first visual indication of a first conduit status of the first conduit at the first region of the thermochromic structure.

In some embodiments, a conduit check apparatus is provided. The conduit check apparatus includes a thermochromic structure. The thermochromic structure includes a first region overlying a first conduit configured to emit a first gas. The thermochromic structure includes a second region overlying a second conduit configured to emit a second gas. The conduit check apparatus includes a heating assembly configured to heat the thermochromic structure while the first gas is emitted from the first conduit and the second gas is emitted from the second conduit. The first region of the thermochromic structure produces a first visual indication of a first conduit status of the first conduit. The second region of the thermochromic structure produces a second visual indication of a second conduit status of the second conduit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" and/or the like is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A system, comprising:
an electrostatic chuck defining a first conduit configured to emit a first gas; and
a conduit check apparatus for identifying a first conduit status of the first conduit, wherein:
the conduit check apparatus comprises a thermochromic structure comprising a first region positioned relative to a flow path of the first gas emitted from the first conduit; and
the first region of the thermochromic structure produces a first visual indication of the first conduit status.

2. The system of claim 1, wherein the thermochromic structure comprises:
thermochromic liquid crystal (TLC).

3. The system of claim 1, wherein:
the electrostatic chuck defines a second conduit configured to emit a second gas;
the thermochromic structure comprises a second region positioned relative to a flow path of the second gas emitted from the second conduit; and
the second region of the thermochromic structure produces a second visual indication of a second conduit status of the second conduit.

4. The system of claim 1, wherein the conduit check apparatus comprises:
a heating assembly configured to heat the thermochromic structure while the first gas is emitted from the first conduit.

5. The system of claim 4, wherein the heating assembly comprises:
a first heater; and
a second heater spaced apart from the first heater by a separation region, wherein the separation region overlies the first region of the thermochromic structure.

6. The system of claim 5, wherein:
the conduit check apparatus comprises a platform;
the first heater and the second heater are coupled to a first side of the platform; and
the thermochromic structure is coupled to a second side of the platform opposing the first side of the platform.

7. The system of claim 6, wherein:
the thermochromic structure is coupled to the second side of the platform via ultraviolet (UV)-cured resin.

8. The system of claim 6, wherein:
the separation region between the first heater and the second heater overlies a display region of the platform; and
the platform comprises a transparent material to provide for visibility of the first visual indication through the display region of the platform.

9. The system of claim 1, wherein:
the first conduit status corresponds to a blockage level of the first conduit.

10. A method comprising:
positioning a conduit check apparatus relative to an electrostatic chuck, wherein the conduit check apparatus comprises a thermochromic structure;
emitting, from a first conduit defined by the electrostatic chuck, a first gas towards a first region of the thermochromic structure; and
producing a first visual indication of a first conduit status of the first conduit at the first region of the thermochromic structure.

11. The method of claim 10, wherein:
the electrostatic chuck is disposed in a processing chamber of a semiconductor processing station; and
positioning the conduit check apparatus relative to the electrostatic chuck comprises transferring the conduit check apparatus to the processing chamber.

12. The method of claim 10, comprising:
heating the thermochromic structure while the first gas is emitted from the first conduit.

13. The method of claim 12, wherein heating the thermochromic structure comprises:
heating the thermochromic structure using a first heater and a second heater spaced apart from the first heater by a separation region, wherein the separation region overlies the first region of the thermochromic structure.

14. The method of claim 10, wherein:
the first conduit status corresponds to a blockage level of the first conduit.

15. The method of claim 10, comprising:
emitting, from a second conduit defined by the electrostatic chuck, a second gas towards a second region of the thermochromic structure; and
producing a second visual indication of a second conduit status of the second conduit at the second region of the thermochromic structure.

16. A conduit check apparatus comprising:
a thermochromic structure comprising:
a first region overlying a first conduit configured to emit a first gas; and
a second region overlying a second conduit configured to emit a second gas; and a heating assembly configured to heat the thermochromic structure while the first gas is emitted from the first conduit and the second gas is emitted from the second conduit, wherein:

the first region of the thermochromic structure produces a first visual indication of a first conduit status of the first conduit; and the second region of the thermochromic structure produces a second visual indication of a second conduit status of the second conduit.

17. The conduit check apparatus of claim 16, wherein the heating assembly comprises:

a first heater; and a second heater spaced apart from the first heater by a separation region, wherein the separation region overlies:

the first region of the thermochromic structure; and the second region of the thermochromic structure.

18. The conduit check apparatus of claim 17, comprising:

a platform, wherein:

the first heater and the second heater are coupled to a first side of the platform; and the thermochromic structure is coupled to a second side of the platform opposing the first side of the platform.

19. The conduit check apparatus of claim 18, wherein:

the thermochromic structure is coupled to the second side of the platform via ultraviolet (UV)-cured resin.

20. The conduit check apparatus of claim 18, wherein:

the separation region between the first heater and the second heater overlies a display region of the platform; and the platform comprises a transparent material to provide for visibility of the first visual indication and the second visual indication through the display region of the platform.

* * * * *